United States Patent
Kwak et al.

(10) Patent No.: US 7,816,937 B2
(45) Date of Patent: Oct. 19, 2010

(54) APPARATUS FOR TESTING A SEMICONDUCTOR PACKAGE

(75) Inventors: Young-Ki Kwak, Cheonan-si (KR);
Chul-Woong Jang, Cheonan-si (KR);
Woon-Sup Choi, Cheonan-si (KR);
Jong-pil Park, Cheonan-si (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 204 days.

(21) Appl. No.: 12/167,000

(22) Filed: Jul. 2, 2008

(65) Prior Publication Data

US 2009/0015287 A1     Jan. 15, 2009

(30) Foreign Application Priority Data

Jul. 11, 2007   (KR) .................. 10-2007-0069509

(51) Int. Cl.
*G01R 31/02* (2006.01)
(52) U.S. Cl. .................... 324/765; 324/754
(58) Field of Classification Search .............. None
See application file for complete search history.

(56) References Cited

U.S. PATENT DOCUMENTS

| | | | | |
|---|---|---|---|---|
| 4,856,904 A | * | 8/1989 | Akagawa | 356/400 |
| 5,166,603 A | * | 11/1992 | Hoshi | 324/758 |
| 5,614,837 A | * | 3/1997 | Itoyama et al. | 324/760 |
| 5,650,732 A | * | 7/1997 | Sakai | 324/755 |
| 6,882,141 B2 | * | 4/2005 | Kim | 324/158.1 |

FOREIGN PATENT DOCUMENTS

| | | |
|---|---|---|
| JP | 2006-337044 | 12/2006 |
| KR | 10-2004-0078244 | 9/2004 |
| KR | 10-0560729 | 3/2006 |

* cited by examiner

*Primary Examiner*—Minh N Tang
(74) *Attorney, Agent, or Firm*—F. Chau & Associates, LLC

(57) ABSTRACT

An apparatus for testing an object includes a test chamber, a guiding member, testing units and a transferring unit. The test chamber is configured to receive the object. The guiding member is arranged extending along a first direction in the test chamber. The testing units are movably connected to the guiding member to test electrical characteristics of the object. The transferring unit is arranged in the test chamber to load the object into one of the testing units and unload the object from one of the testing units. The testing units may be transferred to a position for repair without suspension of the apparatus. The object may be tested using another testing unit while the other testing unit is being repaired.

16 Claims, 3 Drawing Sheets

APPARATUS FOR TESTING A SEMICONDUCTOR PACKAGE

CROSS-REFERENCE TO RELATED APPLICATIONS

This application claims priority under 35 U.S.C. §119 to Korean Patent Application No. 2007-69509, filed on Jul. 11, 2007, in the Korean Intellectual Property Office (KIPO), the disclosure of which is incorporated by reference in its entirety herein.

BACKGROUND OF THE INVENTION

1. Technical Field

The present disclosure relates to an apparatus for testing an object, and more particularly to an apparatus for testing electrical characteristics of a semiconductor package.

2. Discussion of Related Art

A semiconductor fabricating process may be performed on a wafer to generate a plurality of semiconductor chips. The semiconductor chips may be mounted on a printed circuit board (PCB) during a packaging process to generate a semiconductor package. Electrical characteristics of the semiconductor package manufactured by the above-mentioned processes may be tested using an apparatus for testing the semiconductor package.

A conventional apparatus for testing the semiconductor package may include a test chamber, a plurality of testing units fixed to a floor of the test chamber, and a transferring unit for transferring the semiconductor package to the testing units.

However, since the testing units are fixed to the floor of the test chamber, operations of the apparatus may need to be suspended before one of the testing units can be replaced or repaired. Suspending the operations may delay testing of the semiconductor package.

The testing may be further delayed because the semiconductor package is loaded to or unloaded from the testing units using only the single transferring unit.

SUMMARY OF THE INVENTION

An apparatus for testing an object in accordance with an exemplary embodiment of the present invention includes a test chamber, a guiding member, testing units and a transferring unit. The test chamber is configured to receive the object. The guiding member is arranged extending along a first direction in the test chamber. The testing units are movably connected to the guiding member to test electrical characteristics of the object. The transferring unit is arranged in the test chamber to load the object into one of the testing units and unload the object from one of the testing units.

The guiding member may include a pair of rails arranged on a floor of the test chamber that is configured to movably support at least one of the testing units. The pair of rails may be arranged in rows on the floor of the test chamber along a second direction substantially perpendicular to the first direction.

The guiding member may include a pair of lead screws arranged on a floor of the test chamber that is configured to be threadedly combined with at least one of the testing units. The pair of lead screws may be arranged in rows on the floor of the test chamber along the second direction.

The transferring unit may include a shuttle arranged movably along the second direction in the test chamber to transfer the object to a position adjacent to the testing units, and a robot mechanism arranged movably along the second direction in the test chamber to load the object into one of the testing units and unload the object from the testing unit via the shuttle. The transferring unit may include a conveyor arranged on a floor of the test chamber to move the shuttle.

The robot mechanism may include a first robot and a second robot. The first robot may be arranged movably along the second direction in the test chamber to load the object into the shuttle and unload the object from the shuttle. The second robot may be arranged movably along the second direction in the test chamber to load the object from the shuttle to one of the testing units and unload the object from one of the testing units to the shuttle. The robot mechanism may further include a lead screw arranged on a ceiling of the test chamber. The first robot and the second robot may be moved along the lead screw arranged on the ceiling of the test chamber.

The apparatus may further include a contacting unit arranged over the testing units to downwardly press the object onto one of the testing units to enable an electrical contact between the object and the testing unit. The contacting unit may include a contacting member for making contact with the object, a vertical driving member for lifting the contacting member, and a horizontal driving member arranged on the ceiling of the test chamber and connected to the vertical driving member to move the contacting member along the first direction.

An apparatus for testing an object in accordance with an exemplary embodiment of the present invention includes a test chamber, testing units, a shuttle and a robot mechanism. The test chamber is configured to receive the object. The testing units are arranged in the test chamber to test electrical characteristics of the object. The shuttle is arranged movably in the test chamber to transfer the object to a position adjacent to the testing units. The robot mechanism is arranged in the test chamber to load the object into one of the testing units and unload the object from one of the testing units via the shuttle.

An apparatus for testing a semiconductor package according to an exemplary embodiment of the present invention includes a test chamber, guiding members, testing units, a conveyor, a shuttle, a lead screw, a first robot, a second robot, and contacting unit. The test chamber is configured to receive the semiconductor package. The guiding members extend along a first direction on edge portions of a floor of the test chamber and are arranged in rows along a second direction substantially perpendicular to the first direction. The testing units are movably connected to the guiding members to test electrical characteristics of the semiconductor package. The conveyor extends along the second direction on a central portion of the floor of the test chamber between the guiding members. The shuttle is movably connected to the conveyor to transfer the semiconductor package to a position adjacent to one of the testing units. The lead screw extends along the second direction on a ceiling of the test chamber. The first robot is threadedly combined with the lead screw to load the semiconductor package into the shuttle and unload the shuttle from the shuttle. The second robot is threadedly combined with the lead screw to load the semiconductor package into the testing units from the shuttle and unload the semiconductor package from the testing units to the shuttle. The contacting unit is arranged over the testing units to downwardly press the semiconductor package onto one of the testing units to enable an electrical contact between the semiconductor package and the testing unit.

BRIEF DESCRIPTION OF THE DRAWINGS

The present invention will become more apparent by describing in detail exemplary embodiments thereof with reference to the accompanying drawings, in which.

DETAILED DESCRIPTION OF EXEMPLARY EMBODIMENTS

Figure 1:
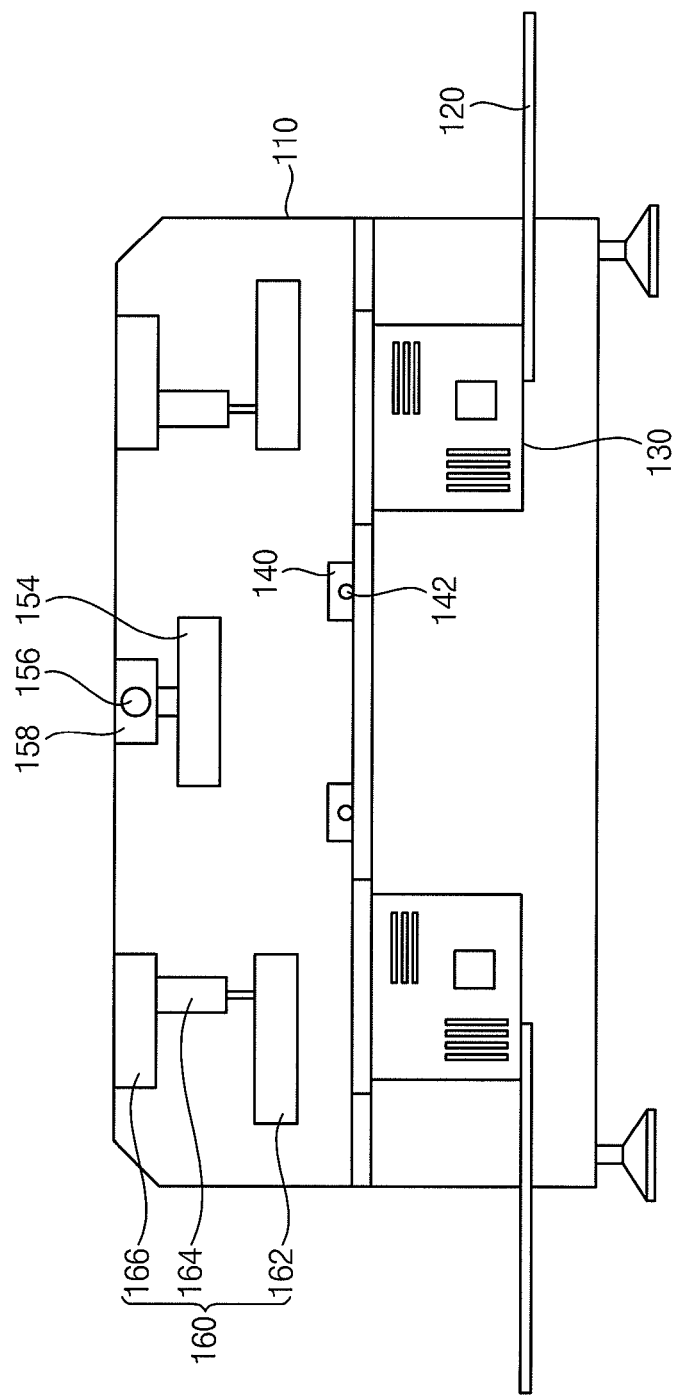
FIG. 1 is a cross-sectional view illustrating an apparatus for testing an object according to an exemplary embodiment of the present invention.

Exemplary embodiments of the present invention will be described more fully hereinafter with reference to the accompanying drawings. The present invention may, however, be embodied in many different forms and should not be construed as limited to the exemplary embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numerals refer to like elements throughout.

Figure 2:
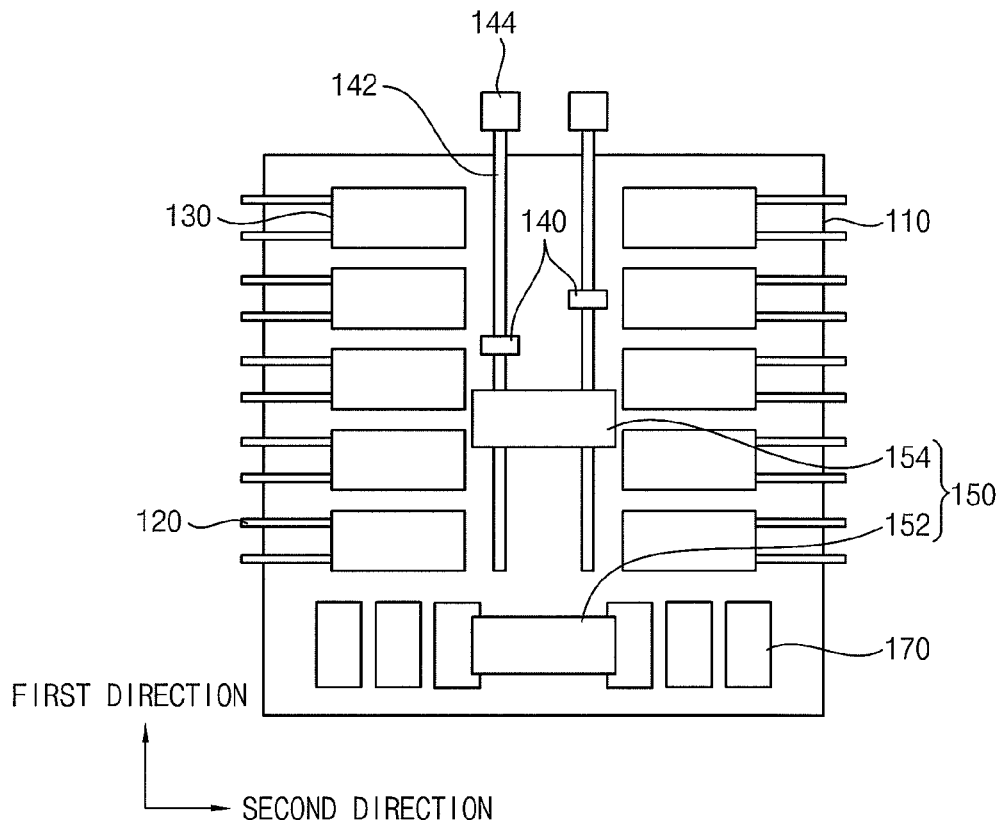
FIG. 2 is a plan view illustrating the apparatus in FIG. 1.
Figure 3:
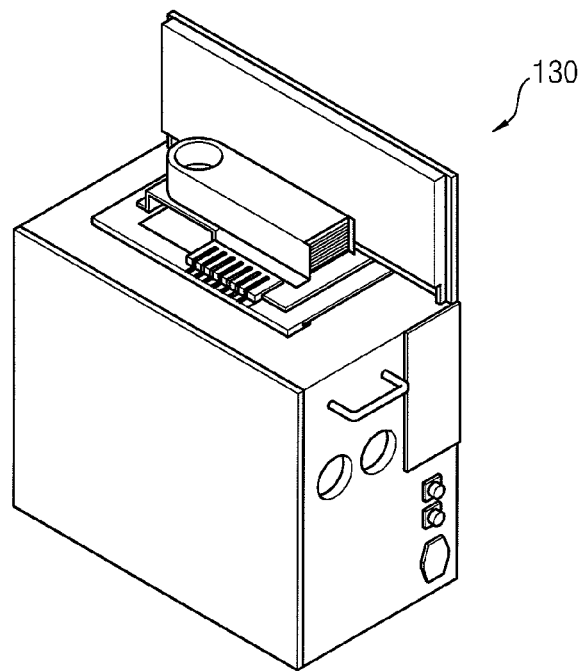
FIG. 3 is a perspective view illustrating the apparatus in FIG. 1.

FIG. 1 is a cross-sectional view illustrating an apparatus for testing an object according to an exemplary embodiment of the present invention, FIG. 2 is a plan view illustrating the apparatus in FIG. 1, and FIG. 3 is a perspective view illustrating the apparatus in FIG. 1.

Referring to FIGS. 1 to 3, the apparatus 100 includes a test chamber 110, a guiding member, testing units 130, a transferring unit and contacting units 160. The test chamber 110 is configured to receive the object that is to have its electrical characteristics tested. The object may include a semiconductor package. Alternatively, the object may include other electronic parts in addition to the semiconductor package. Trays 170 configured to receive the semiconductor packages are arranged in the test chamber 110.

The guiding member is arranged on a floor of the test chamber 110 along a first direction. The guiding member may include a pair of rails 120. The rails 120 may be arranged in two rows on the floor of the test chamber 110 along a second direction substantially perpendicular to the first direction. For example, there may be five pairs of the rails 120 in a left region and a right region of the test chamber 110, respectively. Thus, the total number of pairs of the rails 120 may number ten. However, exemplary embodiments of the present invention are not limited to ten rails, as each of the regions may contain a varying number of rails.

The testing units 130 for testing the electrical characteristics of the semiconductor packages are slidably connected to the rails 120. Thus, the testing units 130 may be moved on the rails along the first direction. A testing unit 130 that is in need of repair may be moved along the rail 120 to a repair position for a repair. As a result, the testing unit 130 may be repaired without suspension of the apparatus 100. In one embodiment of the present invention, the testing units 130 may be moved manually by an individual, such as a technician. Further, due to the plurality of rails, the testing units 130 may be arranged at various positions in the test chamber 110.

The transferring unit loads the semiconductor packages into the testing units 130 from the trays 170 and unloads the tested semiconductor packages into the trays 170 from the testing units 130. The transferring unit includes shuttles 140 and a robot mechanism 150.

The shuttles 140 are movably arranged on the floor of the test chamber 110 along the second direction. In an embodiment of the present invention, the shuttles 140 are movably connected to conveyors 142 that are arranged on a central portion of the floor of the test chamber 110 along the second direction. The position of the conveyors 142 may be adjusted using elements 144. For example, when the elements 144 are lead screws, the conveyors 142 may be rotated manually or automatically rotated using a motor. The elements 144 may also function as terminators so that the shuttles 140 are bounded. The elements 144 may also function as tabs that can be used to adjust the vertical position of the conveyors 142. The shuttles 140 may be arranged between the testing units 130 to be selectively located at fronts of the testing units 130. The semiconductor packages may be loaded into the shuttles 140 from the trays 170. The semiconductor packages in the shuttles 140 may be transferred to the fronts of the testing units 130. Further, the tested semiconductor packages may be loaded into the shuttles 140 from the testing units 130. The semiconductor packages may be transferred to positions adjacent to the trays 170 by the shuttles 140.

In an exemplary embodiment of the present invention, the testing units 130 are arranged in a row in the left region and a row in the right region of the test chamber 110. A pair of the shuttles 140 may be provided so that one of the pair of shuttles 140 may be used to load the semiconductor packages into a testing unit 130, while the other of the pair of shuttles 140 may be used to unload a semiconductor package from a testing unit 130. A pair of the conveyors 142 may be arranged along the second direction at positions adjacent to the fronts of the both testing units 130. As a result, any one of the semiconductor packages may be loaded into any one of the testing units 130 from any one of the shuttles 140 or unloaded from any one of the testing units 130 to any one of the shuttles 140, or another semiconductor package may be transferred to a front of another testing unit 130 by another shuttle 140. Accordingly, a stand-by time of the semiconductor package being tested may be shortened.

The robot mechanism 150 loads the semiconductor package into the testing units 130 from the trays 170 via the shuttles 140 and unloads the semiconductor packages from the testing units 130 to the trays 170. The robot mechanism 150 includes a first robot 152 and a second robot 154. The first robot 152 and the second robot 154 may be threadedly combined with a lead screw 156 fixed to a ceiling of the test chamber 110. A lead screw may be specialized for the purpose of translating rotational motion to linear motion. A motor 158 provides a rotational force to the lead screw 156 to rotate the lead screw 156. The first robot 152 and the second robot 154 are forwardly moved or backwardly moved in accordance with the direction that the lead screw 156 is rotated. In one exemplary embodiment of the present invention, the first robot 152 and the second robot 154 are forwardly and backwardly moved using a single lead screw 156. In an alternative embodiment of the present invention, the first robot 152 and the second robot 154 are forwardly and backwardly moved independently using two lead screws 156.

The first robot 152 is arranged adjacent to the trays 170. The first robot 152 transfers the semiconductor packages in the trays 170 to the shuttles 140. Further, the first robot 152 transfers the semiconductor packages in the shuttles 170 to the trays 170.

The second robot 154 is arranged between the shuttles 140. The second robot 154 loads the semiconductor packages in the shuttle 140 into the testing units 130. Further, the second robot 154 loads the semiconductor packages in the testing units 130 into the shuttles 140. In an exemplary embodiment of the present invention, there is only one second robot 154. In an alternate embodiment of the present invention, the numbers of the second robot 154 correspond to those of the shuttles 140, so that the second robots 154 may independently load the semiconductor packages into the shuttles 140.

The contacting units 160 are arranged over the testing units 130. The contacting units 160 downwardly press the semiconductor packages on the testing units 130 to enable an electrical contact between the semiconductor packages and the testing units 130.

Each of the contacting units 160 includes a contacting member 162, a vertical driving member 164 and a horizontal driving member 166. The contacting member 162 makes contact with the semiconductor packages to downwardly press the semiconductor packages. The vertical driving member 164 is connected to the contacting member 162 to lift the contacting member 162. The horizontal driving member 166 is connected to the vertical driving member 164 to horizontally move the contacting member 162. The horizontal driving member 166 is fixed to the ceiling of the test chamber 110. Examples of the vertical driving member 164 and the horizontal driving member 166 may include a pneumatic cylinder, a hydraulic cylinder and the like. Alternatively, the vertical driving member 164 and the horizontal driving member 166 may include a motor, a lead screw and the like.

According to at least one of the above described embodiments, the testing units may be independently moved along the rails so that a testing unit may be transferred to a position for repair. Thus, a testing unit in need of repair may be repaired without shutting down the apparatus. Further, while one semiconductor package is loaded into the testing unit, another semiconductor package may be transferred to another testing unit using the shuttle. Therefore, the stand-by time of a semiconductor package being tested may be shortened. As a result, a test time of the semiconductor package may be reduced.

Figure 4:
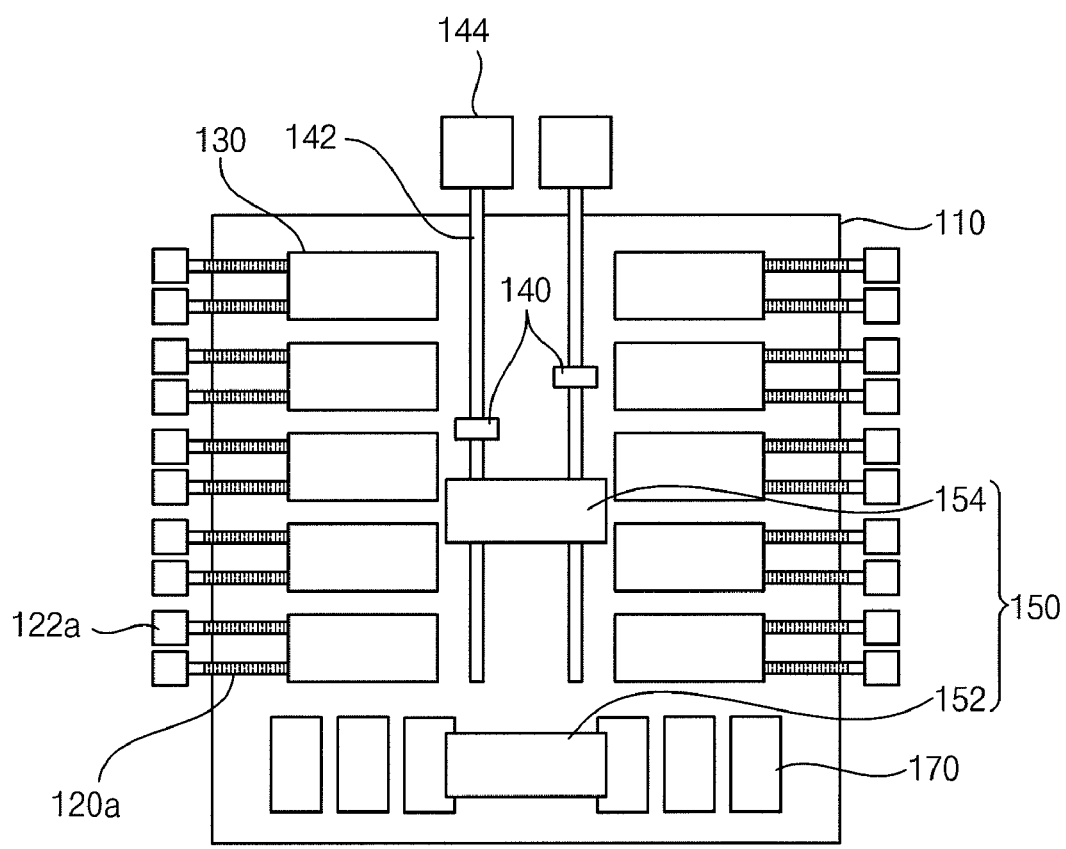
FIG. 4 is a plan view illustrating an apparatus for testing an object according to an exemplary embodiment of the present invention.

FIG. 4 is a plan view illustrating an apparatus for testing an object according to another exemplary embodiment of the present invention. The apparatus 100a includes substantially the same elements as those of the apparatus 100 illustrated in FIG. 2, except for a guiding member. Thus, the same reference numerals refer to the same elements and any further illustrations with respect to the same elements are not required.

Referring to FIG. 4, the guiding member of the apparatus 100a includes a lead screw 120a. The testing units 130 are threadedly combined with the lead screw 120a. The lead screw 120a is connected to a motor 122a to receive a rotational force from the motor 122a. Thus, the testing units 130 are forwardly or backwardly moved in accordance with rotational directions of the lead screw 120a. As a result, the testing units 130 may not need to be moved manually.

The testing units 130 may be automatically moved by the lead screw so that a testing unit in need of repair may be readily transferred to a position where the testing unit may be repaired.

According to at least one exemplary embodiment of the present invention, the testing units may be moved along a guiding member in a testing apparatus. Thus, the testing units may be transferred to a position where the testing units may be repaired without the suspension of the apparatus. Therefore, a semiconductor package may be continuously tested using another testing unit while the other testing unit is repaired. As a result, a time for testing a semiconductor package may be shortened.

The foregoing is illustrative of the present invention and is not to be construed as limiting thereof. Although a few exemplary embodiments of the present invention have been described, those skilled in the art will readily appreciate that many modifications are possible in the exemplary embodiments without materially departing from the teachings of the present invention. Accordingly, all such modifications are intended to be included within the scope of the present invention.

What is claimed is:

1. An apparatus for testing an object, the apparatus comprising:
    a test chamber configured to receive the object;
    a guiding member extending along a first direction in the test chamber;
    testing units movably connected to the guiding member to test electrical characteristics of the object;
    a transferring unit arranged in the test chamber to load the object into one of the testing units and unload the object from one of the testing units; and
    a contacting unit arranged over the testing units to downwardly press the object onto one of the testing units to enable an electrical contact between the object and the testing unit, wherein the contacting unit comprises:
        a contacting member for making contact with the object;
        a vertical driving member connected to the contacting member to lift the contacting member; and
        a horizontal driving member connected to the vertical driving member and fixed to a ceiling of the test chamber to move the contacting member along the first direction.

2. The apparatus of claim 1, wherein the guiding member comprises a pair of rails arranged on a floor of the test chamber, and wherein the pair of rails is configured to movably support at least one of the testing units.

3. The apparatus of claim 2, wherein the pair of rails are arranged in rows along a second direction substantially perpendicular to the first direction on the floor of the test chamber.

4. The apparatus of claim 1, wherein the guiding member comprises a pair of lead screws arranged on a floor of the test chamber, and wherein the pair of lead screws is threadedly combined with at least one of the testing units.

5. The apparatus of claim 4, wherein the pair of lead screws are arranged in rows along a second direction substantially perpendicular to the first direction on the floor of the test chamber.

6. The apparatus of claim 1, wherein the transferring unit comprises:
    a shuttle movably arranged in the test chamber along a second direction substantially perpendicular to the first direction to transfer the object to a position adjacent to the testing units; and
    a robot mechanism movably arranged in the test chamber along the second direction to load the object into one of the testing units and unload the object from one of the testing units via the shuttle.

7. The apparatus of claim 6, wherein the transferring unit further comprises a conveyor arranged on a floor of the test chamber to move the shuttle.

8. The apparatus of claim 6, wherein the robot mechanism comprises:
   a first robot movably arranged in the test chamber along the second direction to load the object into the shuttle and unload the object from the shuttle; and
   a second robot movably arranged in the test chamber along the second direction to load the object into one of the testing units from the shuttle and unload the object from one of the testing units to the shuttle.

9. The apparatus of claim 8, wherein the robot mechanism further comprises a lead screw arranged on a ceiling of the test chamber to move the first robot and the second robot.

10. The apparatus of claim 1, wherein the object comprises a semiconductor package.

11. An apparatus for testing an object, the apparatus comprising:
   a test chamber configured to receive the object;
   testing units arranged in the test chamber to test electrical characteristics of the object;
   a shuttle movably arranged in the test chamber to transfer the object to a position adjacent to the testing units;
   a robot mechanism movably arranged in the test chamber to load the object into one of the testing units and unload the object from one of the testing units via the shuttle; and
   a contacting unit arranged over the testing units to downwardly press the object on one of the testing units to enable an electrical contact between the object and the testing unit, wherein the contacting unit comprises:
      a contacting member for making contact with the object;
      a vertical driving member connected to the contacting member to lift the contacting member; and
      a horizontal driving member connected to the vertical driving member and fixed to a ceiling of the test chamber to move the contacting member.

12. The apparatus of claim 11, further comprising a conveyor arranged on a floor of the test chamber to move the shuttle.

13. The apparatus of claim 11, wherein the robot mechanism comprises:
   a first robot movably arranged in the test chamber to load the object into the shuttle and unload the object from the shuttle; and
   a second robot movably arranged in the test chamber to load the object into one of the testing units from the shuttle and unload the object from one of the testing units to the shuttle.

14. The apparatus of claim 13, wherein the robot mechanism further comprises a lead screw arranged on a ceiling of the test chamber to move the first robot and the second robot.

15. An apparatus for testing a semiconductor package, the apparatus comprising:
   a test chamber configured to receive the semiconductor package;
   guiding members extending along a first direction on edge portions of a floor of the test chamber and arranged in rows along a second direction substantially perpendicular to the first direction;
   testing units movably connected to the guiding members to test electrical characteristics of the semiconductor package;
   a conveyor extending along the second direction on a central portion of the floor of the test chamber between the guiding members;
   a shuttle movably connected to the conveyor to transfer the semiconductor package to a position adjacent to one of the testing units;
   a lead screw extending along the second direction on a ceiling of the test chamber;
   a first robot threadedly combined with the lead screw to load the semiconductor package into the shuttle and unload the shuttle from the shuttle;
   a second robot threadedly combined with the lead screw to load the semiconductor package into the testing units from the shuttle and unload the semiconductor package from the testing units to the shuttle; and
   a contacting unit arranged over the testing units to downwardly press the semiconductor package onto one of the testing units to enable an electrical contact between the semiconductor package and the testing unit, wherein the contacting unit comprises:
      a contacting member for making contact with the semiconductor package;
      a vertical driving member connected to the contacting member to lift the contacting member; and
      a horizontal driving member connected to the vertical driving member and fixed to a ceiling of the test chamber to move the contacting member.

16. The apparatus of claim 15, wherein the conveyor comprises a first and second conveyor arranged in two rows adjacent to two rows of the testing units.

* * * * *